(12) United States Patent
Wadland et al.

(10) Patent No.: US 7,574,686 B1
(45) Date of Patent: Aug. 11, 2009

(54) METHOD AND SYSTEM FOR IMPLEMENTING DETERMINISTIC MULTI-PROCESSING

(75) Inventors: Ken Wadland, Grafton, MA (US);
Randall Lawson, Westford, MA (US);
Charles W. Grant, Leominster, MA (US)

(73) Assignee: Cadence Design Systems, Inc., San Jose, CA (US)

( * ) Notice: Subject to any disclaimer, the term of this patent is extended or adjusted under 35 U.S.C. 154(b) by 429 days.

(21) Appl. No.: 11/503,014

(22) Filed: Aug. 11, 2006

(51) Int. Cl.
*G06F 17/50* (2006.01)
(52) U.S. Cl. .......................................... 716/12; 716/14
(58) Field of Classification Search ................... 716/12, 716/13, 14
See application file for complete search history.

(56) References Cited

U.S. PATENT DOCUMENTS

| | | | | |
|---|---|---|---|---|
| 5,119,317 A * | 6/1992 | Narikawa et al. | ............... | 703/1 |
| 5,245,550 A * | 9/1993 | Miki et al. | ................... | 716/13 |
| 5,644,500 A * | 7/1997 | Miura et al. | ................... | 716/8 |
| 6,324,675 B1 * | 11/2001 | Dutta et al. | ................... | 716/13 |
| 6,370,673 B1 * | 4/2002 | Hill | ............................... | 716/2 |
| 6,543,043 B1 * | 4/2003 | Wang et al. | ................... | 716/14 |
| 6,760,324 B1 * | 7/2004 | Scott et al. | ................... | 370/352 |
| 7,402,897 B2 * | 7/2008 | Leedy | ......................... | 257/678 |
| 7,457,279 B1 * | 11/2008 | Scott et al. | ................... | 370/352 |
| 7,464,358 B1 * | 12/2008 | Wadland et al. | ............... | 716/12 |
| 2002/0157075 A1 * | 10/2002 | Teig et al. | ...................... | 716/10 |
| 2004/0073702 A1 * | 4/2004 | Rong | ......................... | 709/241 |
| 2007/0169042 A1 * | 7/2007 | Janczewski | ................ | 717/149 |

OTHER PUBLICATIONS

U.S. Appl. No. 11/115,042, filed Apr. 25, 2005, Wadland et al.
U.S. Appl. No. 11/098,039, filed Apr. 1, 2005, Wadland et al.

* cited by examiner

*Primary Examiner*—Sun J Lin
(74) *Attorney, Agent, or Firm*—Vista IP Law Group, LLP.

(57) ABSTRACT

Disclosed is a method, system, and computer program product for implementing a costed-search approach that supports concurrent operation on a multi-CPU system that enables out-of-order search evaluation that does not affect the final outcome of the algorithm. The algorithm is guaranteed to produce identical results when run as a single-threaded application on a single-CPU system. This allows a single regression test suite to be used to test single-threaded and multi-threaded versions of the product.

40 Claims, 10 Drawing Sheets

METHOD AND SYSTEM FOR IMPLEMENTING DETERMINISTIC MULTI-PROCESSING

BACKGROUND AND SUMMARY

Many phases of the modern electronic design process are performed using computer aided design (CAD) tools or electronic design automation (EDA) systems. EDA tools are used to implement both printed circuit board (PCB) designs and integrated circuit (IC) designs. For example, an autorouter is a type of EDA tool that automatically determinations the path and location of wires and vias that route between different objects in an electronic design. For an IC design, the autorouter determines the layout and configuration of interconnect polygons and vias on the different metal layers of the IC. For a PCB design, the autorouter determines the configuration of wiring and vias that route between and among electronic objects on the different PCB layers. For an IC Package, the autorouter determines the path and location of wires and vias that route between the bumps (I/O connections) on the IC to the balls (pins) on the PCB. In a System-in-Package (SiP), the autorouter determines the path and location of wires and vias between multiple ICs and devices within the package to the exterior connections of the package.

Increasingly, the electronics industry is trending towards larger and/or more complex electronic designs and systems. Newer generations of IC design are continually escalating the number and concentration of objects that appear on the IC. For PCB and Sip designs, the industry trend is towards more complex designs having increased numbers of constraints. This increase in size and/or complexity dramatically increases the amount of design data for a given electronic design. As the quantity of data in modern electronic designs becomes larger over time, the execution time required to process EDA tools upon these electronic designs also becomes greater. For example, the amount of time needed to route an electronic design also increases as the design data becomes larger or more complex.

Many EDA tool vendors have the goal of improving their products to reduce processing time. For example, autorouters are often judged by their speed of execution. The goal of reducing EDA tool execution time is in sharp tension with the trend of modern electronic designs that are constantly increasing in complexity and/or size. This problem is exacerbated for all EDA tools by constantly improving manufacturing technologies.

To achieve faster tool processing results, it is often desirable to perform EDA processing using multi-processing approaches, e.g., concurrent or parallel processing. Examples of systems that support concurrent or parallel processing include multi-CPU/processor computers, multi-threaded systems, and distributed processing systems having multiple networked nodes.

Traditionally, many EDA tools such as autorouters did not support concurrency. The complexity of implementing autorouting algorithms made it impractical to consider making them concurrent. Recently, a few IC autorouters have begun to support concurrency. A commercially available example of an IC routing tool with concurrency is the Cadence Nanoroute product, available from Cadence Design Systems, Inc. of San Jose, Calif. USA. Most IC autorouters today consist of a global router and a detail router.

Due to the complexity of debugging and maintaining an autorouter, an extensive regression suite is generally needed or desired. If the autorouter is intended for multi-processing operation, then that regression suite must be able to test the multi-processing version of the product. However, such a regression suite would not be able to adequately test the autorouter unless the multi-processing autorouter can operate deterministically. Therefore, a deterministic, concurrent approach is needed to significantly improve performance of an autorouter, particularly for highly constrained designs.

The problem is that systems that exhibit chaotic behavior are notoriously difficult to debug and test. Such chaotic behavior includes a system where minor variations in early stages result in major variations in later stages. Of particular interest are autorouting algorithms, where deciding between two equally good choices for a single path results in dramatically different routing for the entire design. Similarly, concurrent systems are difficult to debug and test because the order of execution is unpredictable. When standard concurrent algorithms are applied to chaotic systems, the result is a product that is impossible to test or verify.

Embodiments of the present invention provide a method, system, and computer program product for implementing an EDA tool which provides deterministic multi-processing. A product is considered "deterministic" if its execution will always produce the same result under the same circumstances. The invention will therefore allow regression testing to verify proper operation of a product. Some embodiments of the invention provide a mechanism by which an EDA tool can be made thread-safe and executed in parallel and still be deterministic. In some embodiments, the invention is embodied as an autorouter that can be executed without negatively impacting quality using a deterministic costed-search approach. The inventive method and system may also be applied to other types of non-EDA systems and tools which employ multi-processing.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present invention provides a method, system, and computer program product for implementing deterministic multi-processing. A product is considered "deterministic" if its execution will always produce the same result under the same circumstances. A product is not deterministic if different results will be observed depending on the number and speed of the devices. Identical runs on identical machines can produce different behavior. This makes it impossible to use regression testing to verify proper operation of the program. Without regression testing, lower quality products are inevitable.

Because the invention supports multi-threading, it allows an autorouter, such as a PCB or IC autorouter, to achieve scalable performance in its path finding algorithm on multi-CPU systems. Since the majority of the time spent in autorouting is in the path finding algorithm, a near linear performance improvement is possible. In addition, because the invention is deterministic, it allows the same regression suite to be used for all testing regardless of the number of threads used or the number of CPUs available. This provides better testing capabilities and ensures better product quality.

Figure 1:
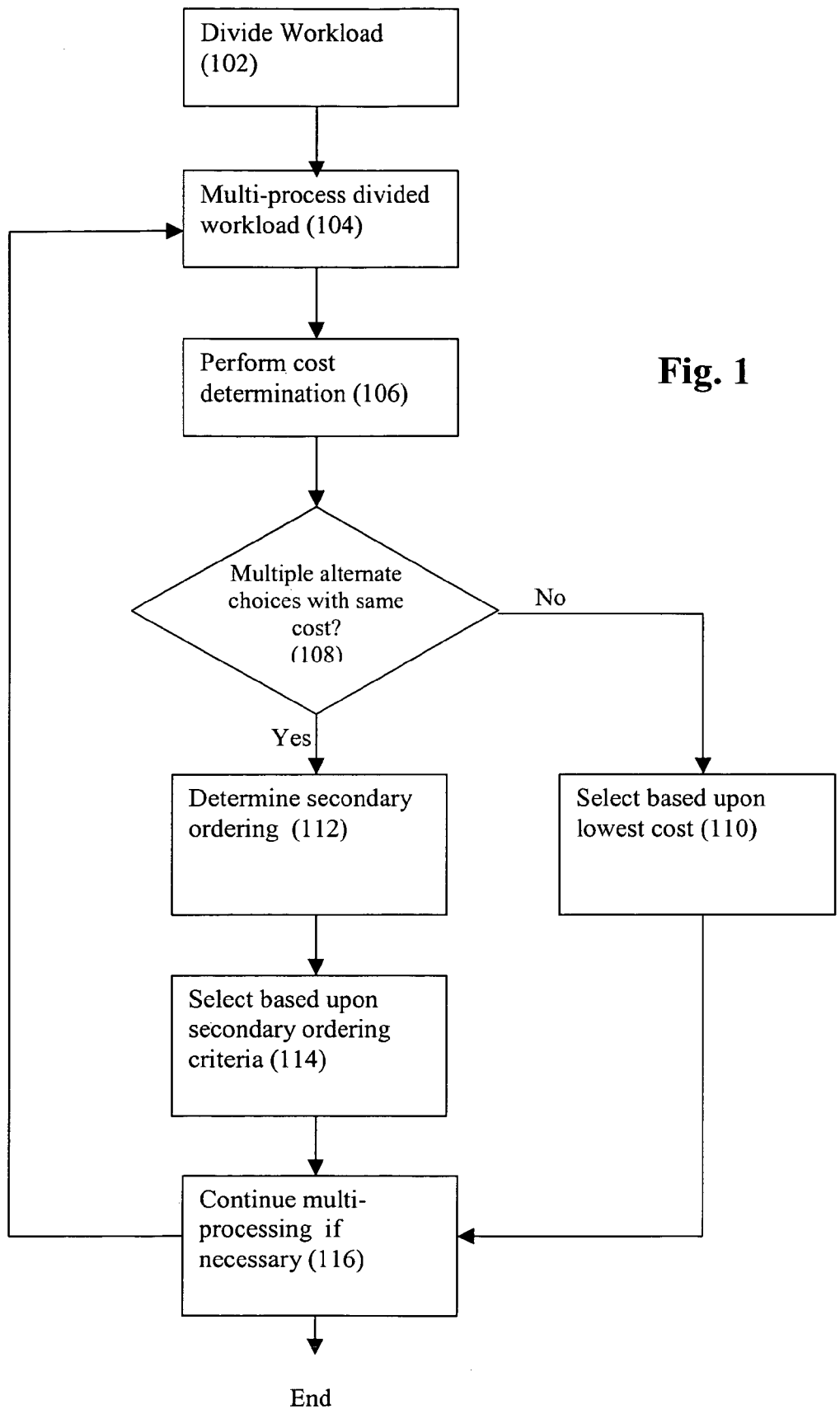
FIG. 1 shows a flowchart of a method for multi-processing according to an embodiment of the invention.

FIG. 1 shows a flowchart of a high-level process for implementing an embodiment of the invention. The first action is to divide the work into portions that can be operated upon by separate processing entities (102). For example, for a software application that operates upon a layout, this action may simply comprise a physical partitioning of the layout into different portions or grids. Examples of such layouts include physical layouts for electronic designs, geographic layouts for GPS systems, and virtual layouts for network routing. Examples of processing entities that may be used to operate upon the different work portions include processors, CPUs, threads, processes, and tasks. For the purposes of illustration only, and not by way of limitation, the present document may illustratively refer to such processing entities as "threads" and may refer to multi-processing approaches as "multi-threading". It is noted, however, that the present invention may be applied to other types of multi-processing systems besides multi-threading, including for example, a parallel processing system having an array of single-threaded networked nodes.

The next action is for the different processing entities to process the work portions (104). In one embodiment, work portions are processed by the different processing entities using a cost-based approach (106). When faced with several alternative choices of actions, the cost-based approach directs the process to select the lowest cost choice. Any cost criteria may be used to determine the cost of a choice or action. For example, an autorouter may consider criteria such as distance, timing, power, and/or blockages when determining the cost of different alternative paths through a layout.

Consider, however, if the processing entity is faced with two or more alternatives choices which all have an identical cost. In this situation, any of the lowest-cost choices would be technically correct and therefore the processing entity may randomly select any of the alternative choices and still end up with a low-cost approach for handling the work. The problem is that random selection process produces a non-deterministic result since it is possible, and indeed quite likely, that different selection of alternative choices will occur from the different executions of the EDA tool, even when starting from the same initial set of work.

In the present embodiment, the process checks whether the processing entity is faced with two or more alternative choices that have the same cost (108). If not, then the processing entity will simply select the lowest cost alternative (110).

If, however, the processing entity is faced with multiple alternative choices which have the same cost, then a determination of a secondary ordering value (also referred to herein as "canonical ordering") is made for each such alternative choice (112). Any suitable ordering approach may be employed for the secondary ordering value, so long as it provides another level of ordering above and beyond the initial costs determinations and is repeatable from one execution of the tool to another. For example, the process may employ alphabetical ordering of an identifier associated with each alternative choice. The secondary criteria need not be based upon actual costs, since it is presumed that the costs of the alternative choices have already been adequately determined and are found to be equal.

The processing entity then selects the alternative choice that has priority based upon the secondary criteria (114). The processing then continues until all the required work portions have been processed (116).

If the secondary criteria does not provide adequate ordering, e.g., because the ordering criteria still produces an equal value/ordering, then additional levels of criteria may be employed to determine an order, so long as the additional levels of criteria are repeatable between different executions of the tool.

In this manner, the tool may be executed using any number of different processing entities using any type of multi-processing approach and is guaranteed to remain deterministic.

DESCRIPTION OF ILLUSTRATIVE EXAMPLE

The present invention will now be described with respect to an illustrative example. The illustrative example may be explained with reference to embodiments directed to multi-threading for autorouters, such as PCB autorouters. It is noted, however, that the illustrative example is provided for illustrative purposes only, and that the present invention is not limited autorouters, and indeed, may be applied to multi-process any type of tool.

Terminology will now be provided that are used to describe the illustrative embodiment(s). For the purposes of the illustrative embodiment(s), a "search" algorithm examines "state-transitions" or actions starting with one or more "initial states" and attempting to reach one or more "final states". Each potential state transition or action is referred to as a "Probe". A state or potential state is referred to as a "Context". An Initial Context is any valid starting state. A Final Context is any valid ending state. A "Solution" is any valid sequence of Probes from any Initial Context to any Final Context.

Figure 2:
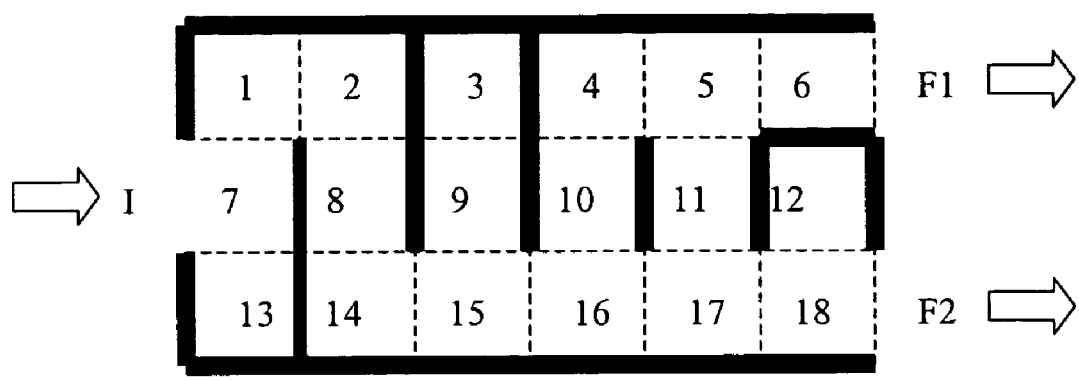
FIG. 2 illustrates an example maze.

For example, consider the maze shown in FIG. 2. This maze represents, for example, the potential routing paths for a PCB design. In this example, there is only one "Initial Context" (labeled "I" next to cell number 7). This represents the only possible entrance to the maze from the left side. There are two possible "Final Contexts", labeled F1 and F2. These represent the two possible exits from the right side of the maze. In this maze, a Probe is any valid state transition from one Context to another. For example "7→1" is a valid Probe. A Probe can be associated with two Contexts, its "from-Context" and its "to-Context". For example, "7→1" has a from-Context of 7 and a to-Context of 1. Another possible probe is "4→5", which has a from-Context of 4 and a to-Context of 5. Although "8→9" is a potential Probe it is not a valid Probe since there is a solid line (or blockage) between its from-Context and its to-Context.

There are several possible solutions to this example maze. One solution is the sequence I→7→1→2 8→14→15→16→17→18→F2. Another solution is I→7→1→2→8→14→15→16→10→4→5→11→17→18→F2".

Each Probe can have a "Cost". For example, if the cost for each Probe in the example is "1", then the lowest cost solution is the sequence I→1→2→8→14→15→16→17→18→F2, since it has 10 transitions and all other possible solutions have more than 10 transitions. However, if the cost function were sum of the numeric values of the cells, then the lowest cost solution is I→7→1→2→8→14→15→16→10→4→5→6→F1, since this has total cost of 88 (the sum of 7+1+2+8, etc.). By comparison, the shorter sequence I7→1→2→8→14→15→16→17→18→F2 has a cost of 98. Thus, the "best" solution might not always be the shortest solution.

The simplest algorithm to support costed-search is a "depth-first" search. In a depth-first search, each possible Probe leaving each Context is explored before examining any other Probes. For example, in maze of FIG. 1, the first Probe to be examined would be I→7. The next Probe to be examined would be either 7→1 or 7→13. If 7→13 is examined first, it will quickly be rejected, since there are no valid Probes leaving cell 13. If 7→1 is examined first, then the next Probe to be examined would be 1→2, since this is the only Probe leaving cell 1. The next Probe to be examined would be 2→8. The search and examination continues in this manner through the maze.

In this example, the algorithm might fail to find a solution. This is because there are possible loops within the maze. After examining 16→10, it will need to examine it again, since 17→16 will lead back to cell 16. To avoid infinite loops, the embodiment should mark the Context as having been visited by a particular Probe. This process of marking the Context is referred to herein as "Acquiring" the Probe.

A depth-first algorithm is fairly straightforward to implement using recursive algorithms. However, it may not necessarily be the best solution. A depth-first approach will either evaluate all possible solutions or quit when a solution is found. If it quits after finding a solution, it will rarely pick the best solution, particularly since, as noted above, the shortest sequence is not always the best solution. If it evaluates all possible solutions, then it is needlessly slow, since it continues to seek solutions after the correct one has been found.

Therefore, in some embodiments of the invention, the search approach involving Probes is implemented with costs, using a costed-search approach. This is particularly advantageous when solving large NP-complete problems, such as the path finding algorithms of an autorouter.

In some embodiments, a costed-search approach uses a priority queue. A queue is a list of objects with a "push" operation to add items to the queue and a "pop" operation to remove items from the queue. In a priority queue, the "pop" operation always removes the highest priority item, in this case higher priority means lower cost. To use the priority queue, the costed-search approach pushes (adds to the queue) zero or more new Probes whenever a Probe is acquired (processed). Once the processing for a Probe has completed, the algorithm pops another Probe to process. In this way, the costed-search approach examines the lowest cost Probes first and will find the "best" solution, if one exists.

The single-threaded approach will now be described. First, all Probes leading from the Initial Context (I→7 in the example of FIG. 2) are pushed onto the Priority Queue. The thread enters a loop popping Probes off of the Priority Queue and processing them. To process a Probe, it checks to see if its Context has already been Acquired. If so, the Probe is discarded, since by definition, the earlier Probe had a lower cost. If not, the Probe Acquires the Context and new Probes leading from that Context are Pushed onto the Priority Queue. This loop continues until a solution is found (e.g., a Final Context is reached) or until the Priority Queue is empty. If a solution is found, a "Walk Back" is performed to determine the state transitions or actions leading to that solution. This is accomplished by starting with the winning Probe and following its predecessor Probes back to their Initial Context.

One concurrent version of this approach is to simply have each thread or process pop Probes off the Priority Queue and process them independently. There are three potential problems with this approach. The first problem is that certain parts of the algorithm may need to be "Atomic", in which concurrent access by two or more threads to the same data are not allowed during that particular operation. For example, two threads should not normally pop Probes off the Priority Queue at the exact same moment because the internal data structures of the Priority Queue may become corrupted. There are many suitable mechanisms to support atomic operations. One suitable approach is locking, which uses operating system primitives such as "critical sections", "thread locks", "monitors" or semaphores. A more recent innovation is "wait-free protocols", typically implemented using an operating system primitive called Compare-and-Swap (CAS). For the purpose of this invention, any suitable mechanism that provides atomic access can be employed.

A second problem is ensuring that the same solution is selected. Since multiple Probes may be processed simultaneously or concurrently, it is entirely possible that two Probes reaching a Final Context are processed at the same time. Either one could be the first one to be selected. This makes the approach non-deterministic.

The third problem is in the Acquire step. In the single-threaded version, the first Probe to reach a Context is the lowest cost Probe that can possibly reach that Context. This may not be true in the concurrent version. Probes might be Pushed onto the Priority Queue by one thread after another thread has popped a Probe which would not have been the first Probe had it waited for them to arrive. This can cause Probes to be processed in different orders depending on the processing speed and the number of threads. This makes the algorithm non-deterministic.

Thus, the exact same program with the exact same input might result in vastly different output each time it is run. This results in a software product that cannot be fully tested. The present embodiment of the invention solves all three problems.

In order to make the algorithm deterministic, a canonical or secondary ordering is employed. A canonical ordering is used to make consistent decisions regardless of the order in which processing occurs. In some embodiments, the canonical ordering is a "Total Ordering". That is, the following four conditions are satisfied:

1. Reflexivity: for all x; it is always true that $x \leq x$.
2. Anti-symmetry: for all x and y; $x \leq y$ and $y \leq x$ implies $x = y$.
3. Transitivity: for all x and y and z; $x \leq y$ and $y \leq z$ implies $x-z$.
4. Comparability (trichotomy law): For any objects x and y, either $x \leq y$ or $y \leq x$.

The normal cost comparison between two Probes meets requirements 1, 3 and 4 but fails to meet requirement 2. This follows from the fact that Probes have a numeric cost. If Probe x has a lower cost Probe y, then $x<y$. But, it does not meet the anti-symmetry requirement because two Probes can have the same cost but still be different. Therefore, cost cannot be used as the canonical ordering.

A secondary comparison function, called the canonical ordering, is used to deal with two Probes that have the same cost. In some embodiments, it does not matter how this ordering is defined provided it is "pure", that is, it depends only on the Probes themselves and not on any external or global states. For example, if the Probe has a length or an angle, then that value can be used as a comparison. If the Probe has a location or an alphanumeric name, it could be used. All that is required is that it meets the anti-symmetry law. That is, given two different Probes, one of them is always "less" than that the other.

When a solution is found, the search does not stop yet. It continues until all Probes with the same numeric cost are processed. Then, if more than one lowest-cost solution is found, the canonical ordering comparison is used to select the "best one". Even though they are equally good, because their costs are equal, to be deterministic, the algorithm must always select the same one.

The Acquisition operation should be configured to use this canonical ordering. When a Probe is first examined, a check is performed to see if its Context has already been acquired. If not, the Probe Acquires the Context and processing continues normally. If the Context has already been acquired by another Probe, special processing decides what to do. For example, consider two Probes "A" and "B". Probe "A" is the one that already acquired this Context. Probe "B" is the one currently being processed. The logic can decide to take one of the following example actions:

1. B can be discarded. No further processing is done for this Probe.
2. B can "re-acquire" the Context. That is, the association between Probe A and the Context is severed and Probe B acquires the Context. What has happened at this point is that Probe B was processed out of order.
3. B can "multiple-acquire" the Context. That is, the Context is acquired by both A and B and normal processing can continue for Probe B.

Which decision is made depends on the specific embodiment of the invention that is used.

Figure 3:
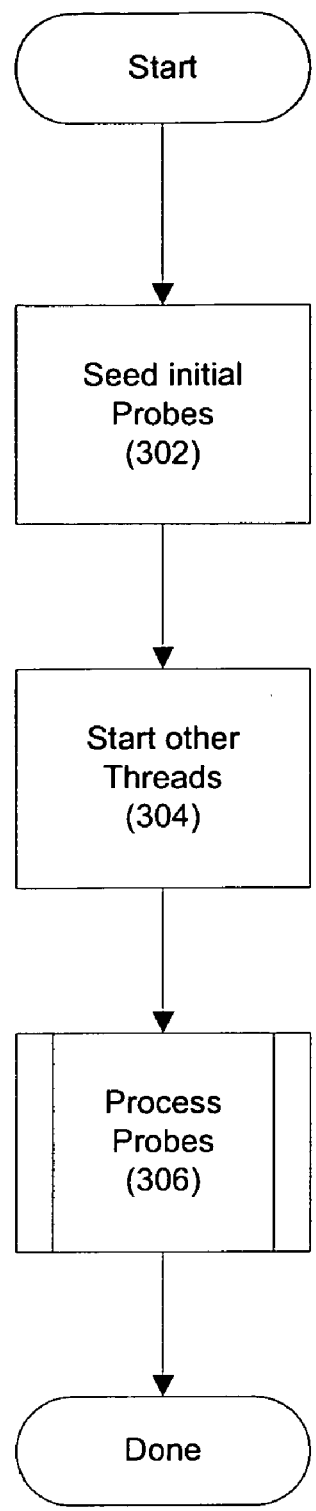
FIG. 3 shows a flowchart of a method for multi-processing according to an embodiment of the invention.

Numerous embodiments of the invention may be used. Prior to describing the alternate embodiments, a basic approach is first described. Referring to FIG. 3, the costed-search method of the basic approach starts in single-threaded mode. The method starts by having the main thread "seed" the priority queue (302). That is, it finds all Probes leaving all legal Initial Context objects and pushes them onto the Priority Queue.

Once the queue is seeded, the main thread starts the other threads and then enters the main loop (304). The threads process probes and then terminate (306).

Figure 4:
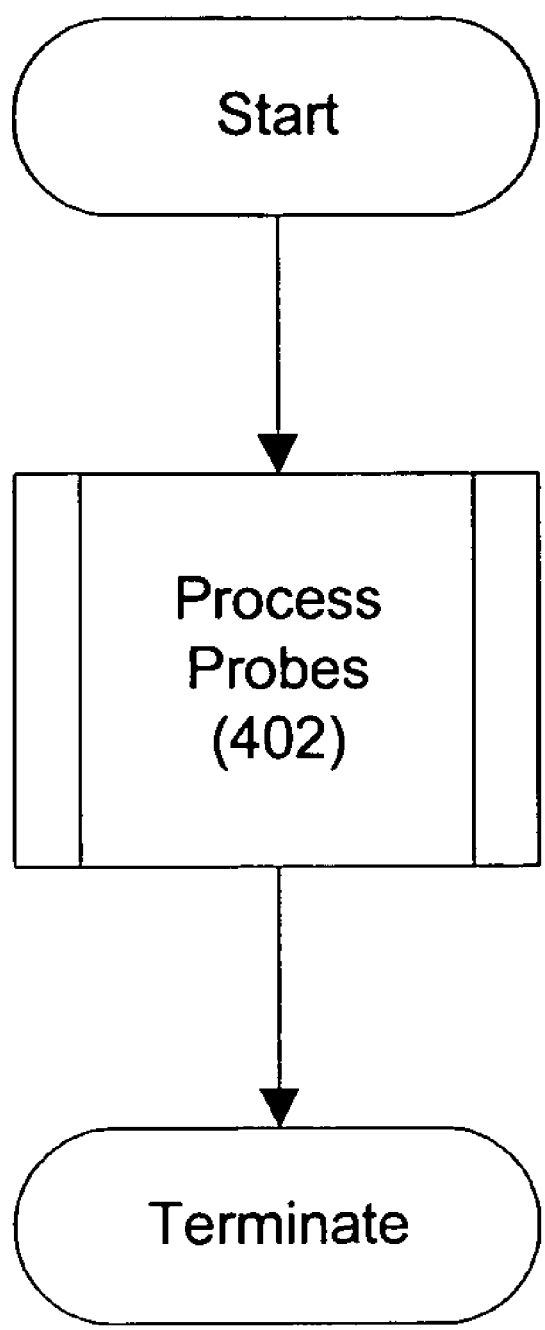
FIG. 4 shows a flowchart of a method directed to other threads according to an embodiment of the invention.

FIG. 4 shows the top-level method for processing the other threads. In particular, a thread would process probes from the priority queue (402).

Figure 5:
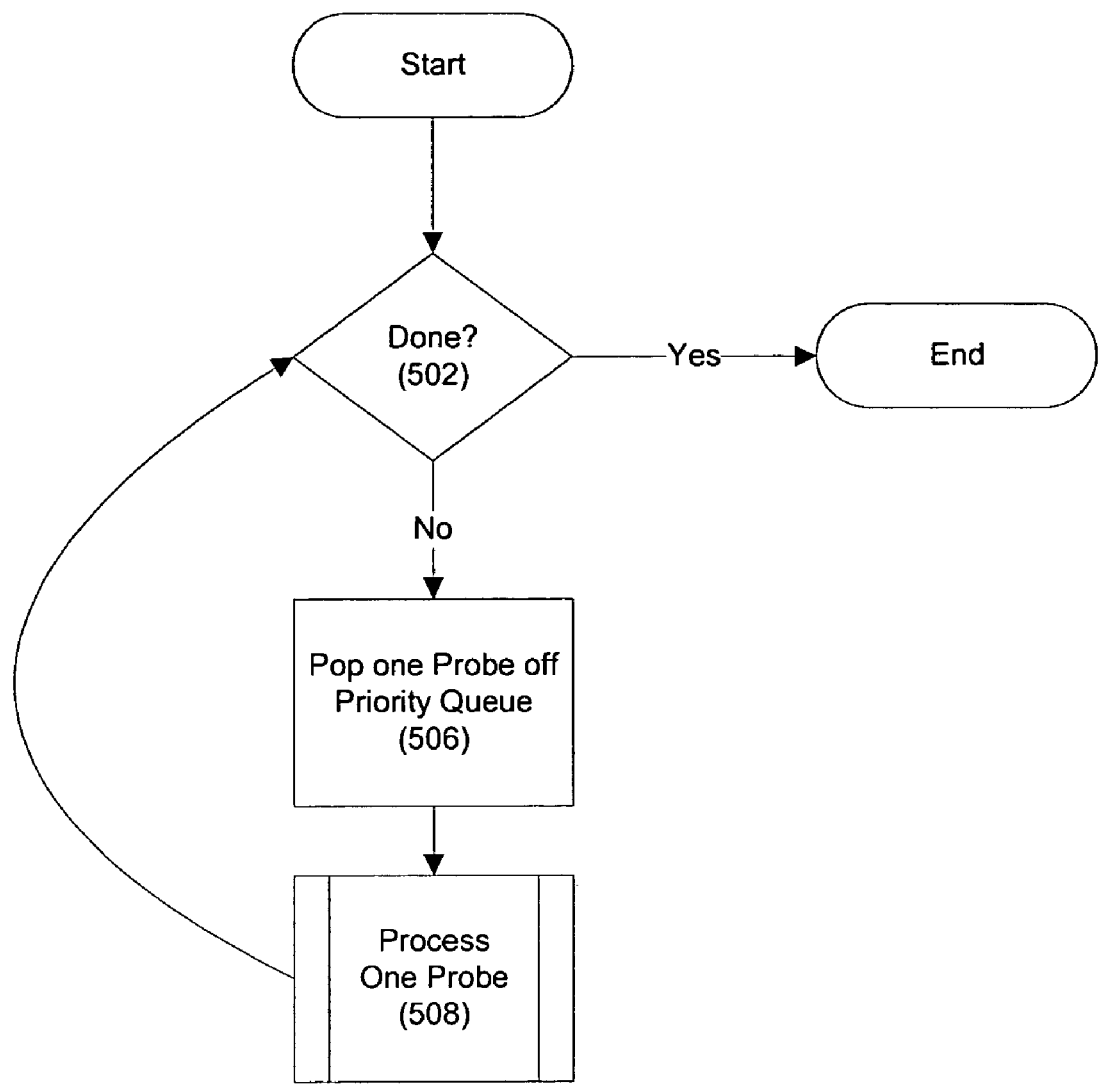
FIG. 5 shows a flowchart of a method for handing single-threaded process-probes according to an embodiment of the invention.

FIG. 5 shows a flowchart of the main loop of the "Process Probes" method that all threads execute. The single-threaded algorithm consists of simply popping Probes off the Priority Queue (506) and processing them (508). The single-threaded algorithm runs until it finds a solution or the priority queue is empty (502).

Unfortunately, in the multi-threaded algorithm, the loop might need to continue even if a solution has been found and the queue is empty. For example, if another thread is currently processing a Probe, it might push new Probe objects onto the queue, making it possible that a better solution will be found.

Figure 6:
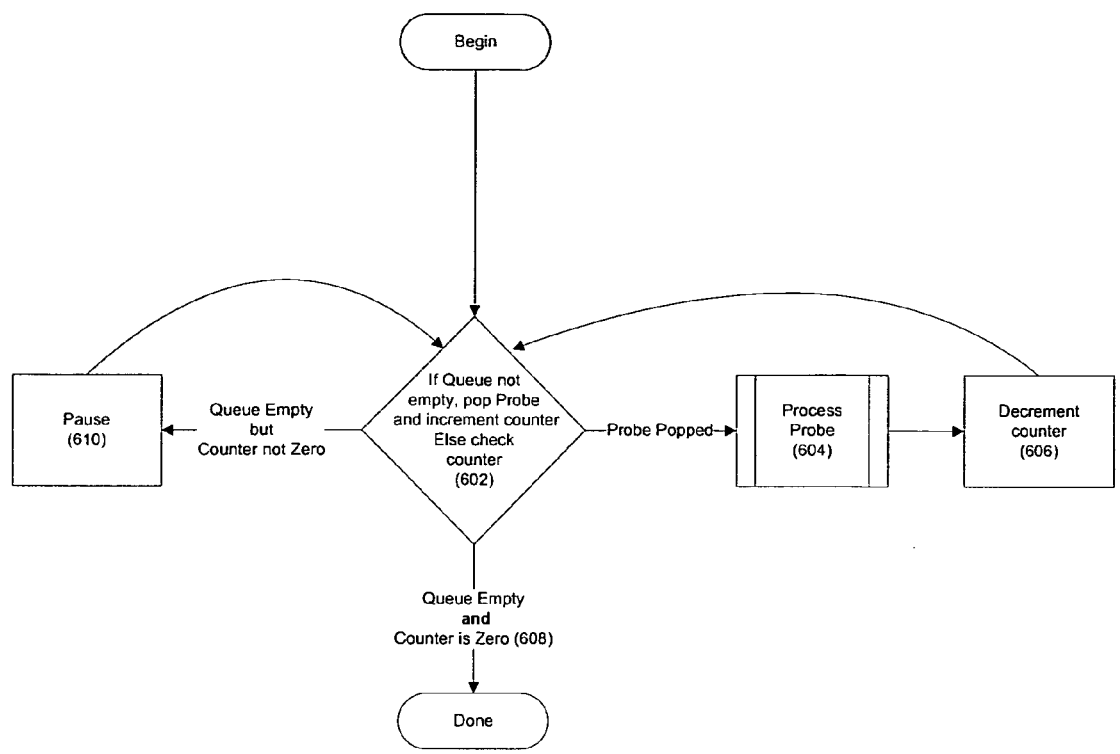
FIG. 6 shows a flowchart of a method for handing concurrent process-probes according to an embodiment of the invention.

One way to address this problem is to have a "busy counter". Referring to FIG. 6, when a Probe is popped, the busy counter is incremented (602). When a thread finishes processing its Probe (604), the busy counter is decremented (606). Threads can then safely exit if the Priority Queue is empty while the busy counter is zero (608). If the queue is empty but the busy counter has a value greater than zero, then the method pauses (610) and returns back to 602 to pop another probe. Note that this test should be atomic. It is not sufficient to first check that the Priority Queue is empty and then check that the busy counter is zero.

Figure 7:
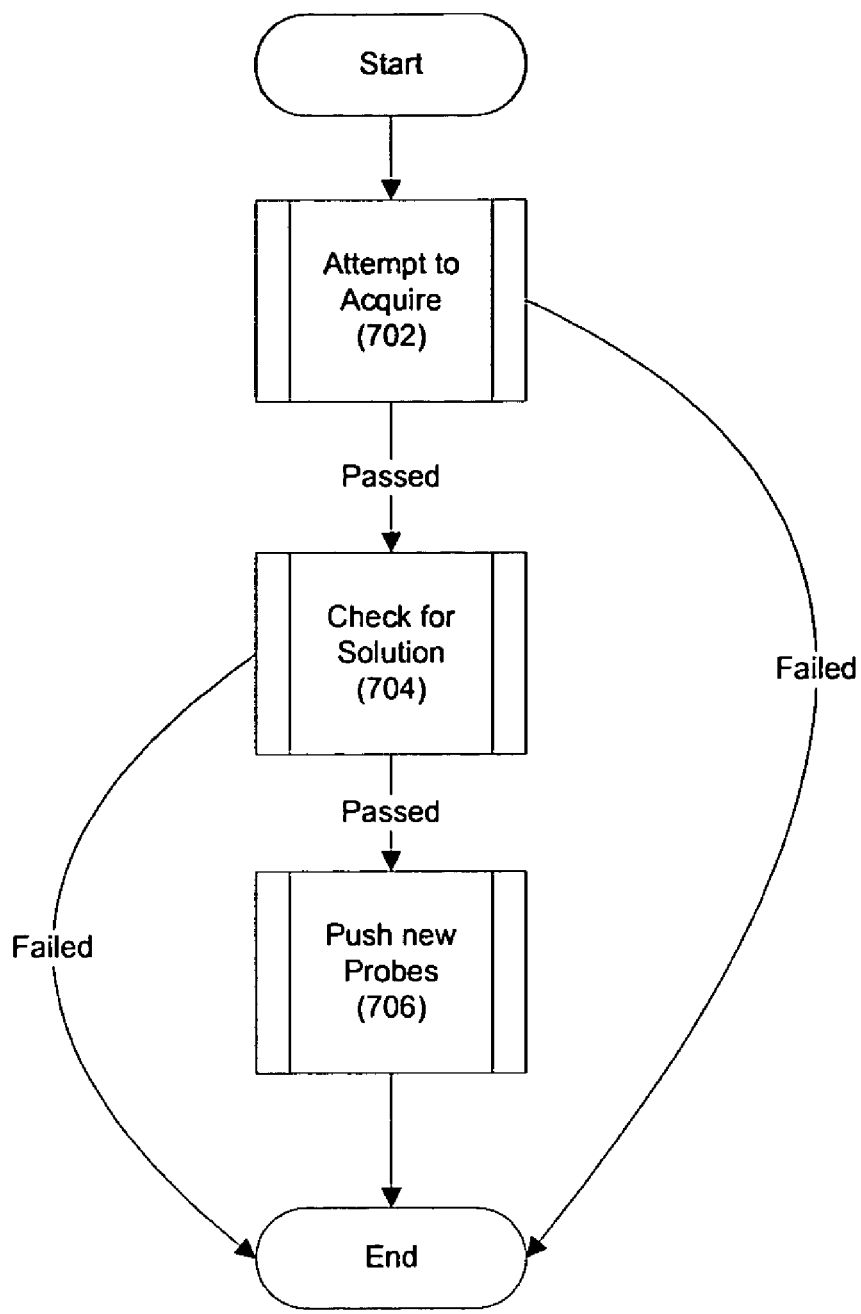
FIG. 7 shows a flowchart of a method for processing a probe according to an embodiment of the invention.

FIG. 7 shows a flowchart of a method to "Process One Probe". A single-threaded version of this algorithm can be implemented as follows. In the "attempt to acquire" action 702, the method determines whether or not the to-Context of this Probe has been acquired by another Probe. If so, then it returns. Since Probes are processed in cost order, if another Probe has acquired this Context, the other Probe must have a lower cost. If not, acquire the Context and continue.

In the "check for solution" action 704, the method determines whether or not this Context (the to-Context from the Probe being processed) is a Final Context. If so, this is a solution. This will generally be the best possible solution, assuming that Probes are processed in cost order. If so, then the method is done.

In the "push new probes" action 706, the method considers all possible legal Probes leaving this Context. If their to-Context has not yet been acquired, push them onto the Priority Queue.

In embodiments that support multi-threading, each of these steps becomes more complicated.

Figure 8:
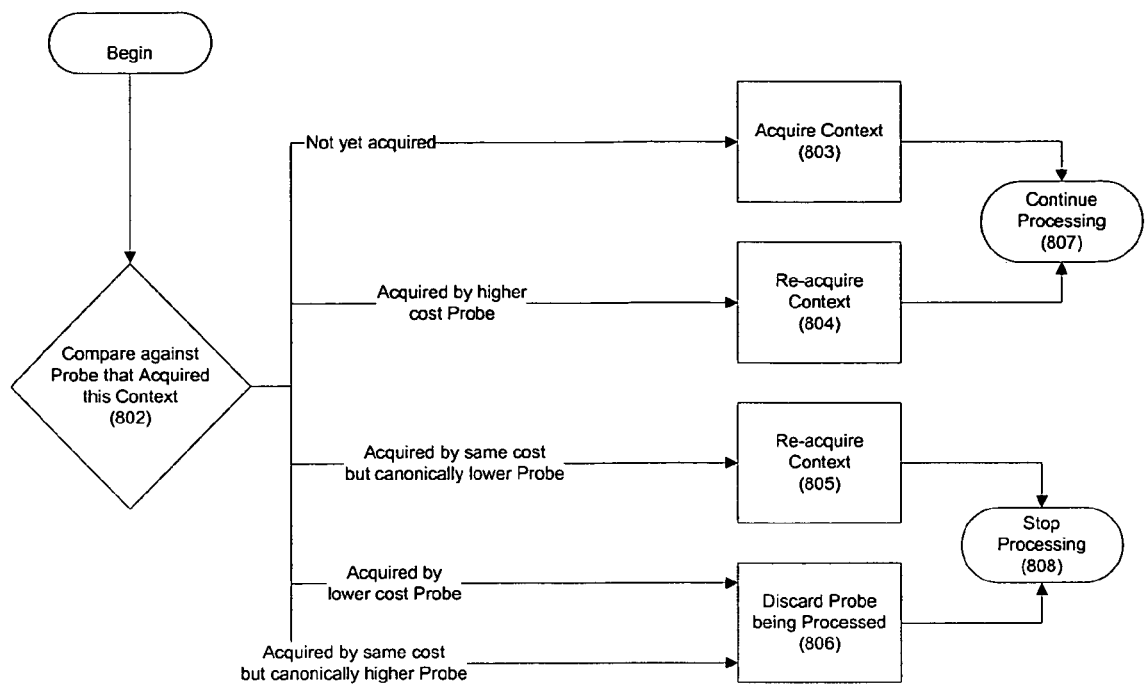
FIG. 8 shows a flowchart of a method for implementing multi-threaded acquisition according to an embodiment of the invention.

FIG. 8 shows a flowchart of a multi-threaded approach for the "attempting to acquire" action 702. To explain, let A represent the Probe that has already acquired this Context, if any. Let B be the Probe being processed. The method compares the Probe A that has acquired this context against Probe B. Atomically, the method selects one of the conditions 803, 804, 805, or 806.

For case 803, there is no Probe A. In this case, the Context has never been processed. Therefore, the method proceeds normally and continues processing (807).

For case 806, either Probe A has lower cost than Probe B or they both had the same cost and Probe A scored lower when using the canonical ordering comparison. In this case, discard Probe B and return. it is noted that Probe A already processed this Context in the proper order. No further processing is needed at this point (808).

For case 805, Probe A has the same cost as Probe B but the canonical ordering comparison scored Probe A higher than Probe B. In this case, the method re-acquires the Context and discard Probe A. This removes the existing association between Probe A and its Context and then associate Probe B with this Context. Since they both have the same cost, it does not matter that Probe A was used to expand from the Context. When the walk back occurs, Probe B will be seen instead of Probe A just as if Probe B had done the expansion.

For case 804, Probe A has a higher cost than Probe B. In this case, the method re-acquires the Context and continue processing (807). This is the out-of-order case, described in more detail below.

In some approaches, cases 803 and 804 can happen only when there is more than one thread running. In some circumstances, they may be unavoidable whenever more than one thread is running, since the alternative would be waiting, which would defeat the performance gains from concurrency.

There is generally no difficulty in handling case 803, since it is quickly recognized and corrected. Once the Context is re-acquired, it is impossible to detect that the Probes were processed out of order. There are minimal performance issues, since both Probes would need to have been examined anyway. There are no deterministic issues, since the canonical ordering comparison ensures the same winning solution, if any, is found.

For case 804, new Probes generated from Probe A will eventually be overtaken by new Probes generated from Probe B, since all Probes generated from Probe A will have an equivalent but lower cost Probe generated from Probe B. There may be a possible performance penalty since processing for Probe A may be lost time. However, the alternative is to wait and not yet process Probe A, which is disadvantageous since on a multi-processor system, waiting is just as inefficient as obtaining a computing result that is discarded. Therefore, overall efficiency is not diminished. In many applications, it is relatively rare that multiple Probes attempt to acquire the same Context, and in fact, in some applications it may be impossible. Provided case 804 is rare, the performance penalty of wasting time is minimal compared to the performance gain of concurrent computation.

The "Check for Solution" action 704 of FIG. 7 for the multi-threaded approach performs the check for the existence of a solution similarly to the single-threaded approach. However, if solution was found (e.g., the Probe has reached a Final Context), then special processing may need to be performed. Unlike the single-threaded algorithm, it may not be possible to know yet whether or not this is the "best" solution. So, the solution is saved for later retrieval and the Priority Queue is "pruned". That is, any Probes currently in the Priority Queue with a higher cost or that compare higher using the canonical ordering comparison are deleted from the Priority Queue. In this way, processing can continue until all remaining Probes are processed.

The "Push new Probes" action 706 of FIG. 7 can be implemented in the multi-threaded approach similarly as to the single-threaded approach, provided the actual "push" operations are atomic. However, because considerable processing time may pass during this action, it may be more efficient to retest prior to pushing the new Probes.

For example, prior to pushing a Probe, a check could be performed to see if the current Probe has still acquired its Context. (Another Probe may have re-acquired it at a lower cost.) If not, a check could be made to determine if the Push is still needed. Similarly, prior to pushing a Probe, a check could be performed to see if its to-Context still needs to be considered. (Another Probe may have acquired it at a lower cost.)

The above description assumes that the canonical ordering is a full ordering comparison operator. That is, for any two different Probes, one of them is "better" than the other. Such an operator might not always be possible. In some cases, it is possible to determine which of two solutions is "better" but not the partial solutions represented by Probes.

Probes might carry more information than just a cost. There might be other considerations besides simply lowest cost. This can occur, for example, in the path finding algorithm of an autorouter. Each Probe might also convey the accumulated length from its Initial Context up to its to-Context. Suppose there were a maximum-length constraint for a solution to be considered valid. It is possible that a Probe might not be able to reach any Final Context without violating its length constraint. Another Probe with a higher cost but the same to-Context might have a lower accumulated length. It is not possible (or at least not computationally efficient) to determine which Probe is "better" without knowing whether or not the lower cost but longer Probe will be able to reach a Final Context.

In cases where a total ordering comparison is not possible, a partial ordering can be used for the canonical ordering. But, more than one Probe must be able to acquire the same Context. This can be used if the Probes carry more information than just a cost. For example, in the path finding algorithms of an autorouter, one Probe might be part of a partial solution (path) using a via. Another Probe might be part of a partial solution that does not use a via. There might be a design rule constraint limiting the solution to one via. In this case, it might not be possible to compare these two Probes, since it is not yet known if another via will be needed to reach a Final Context.

Figure 9:
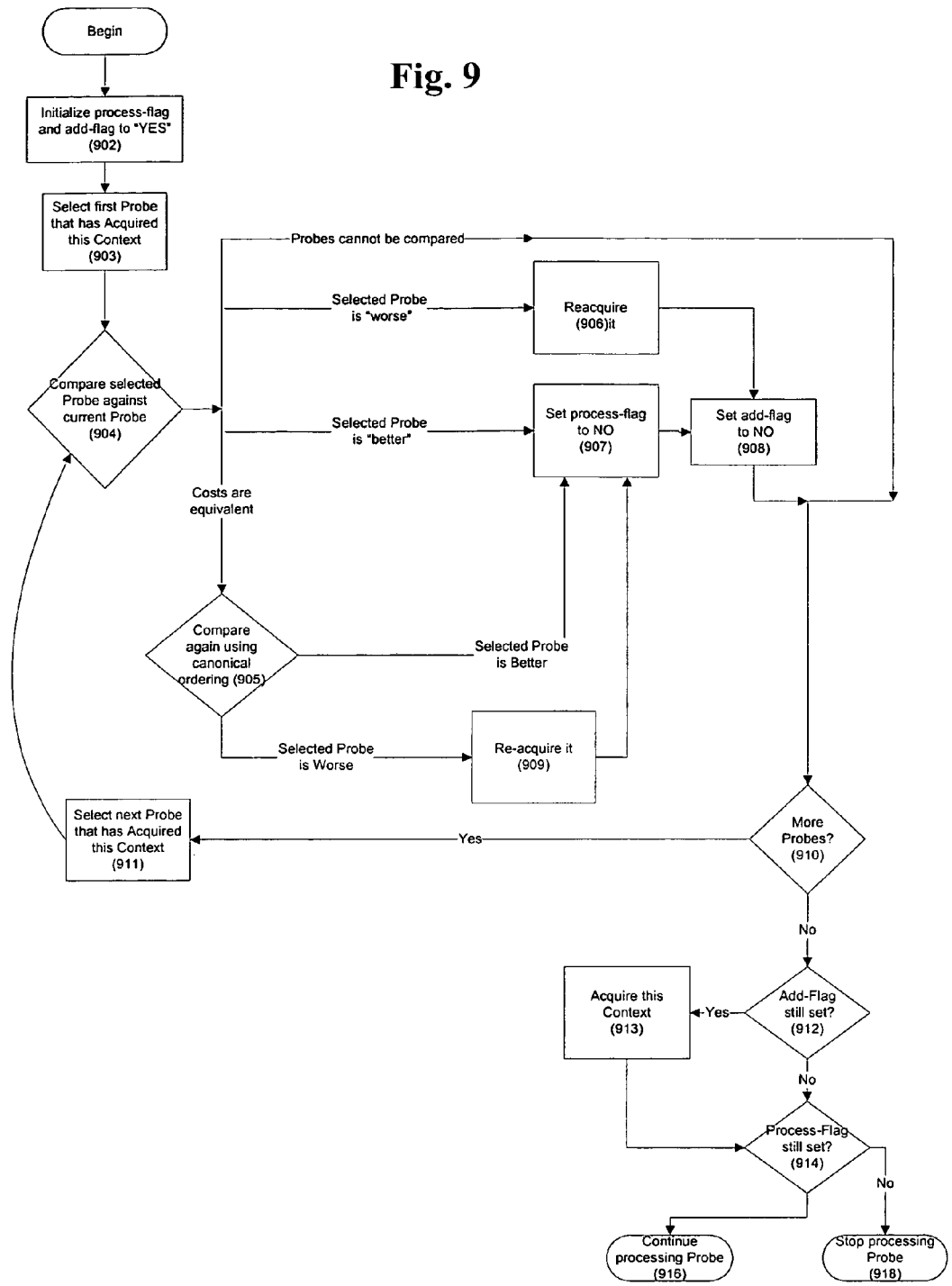
FIG. 9 shows a flowchart of a method for handling partial ordering according to an embodiment of the invention.

For this embodiment, the "Attempt to Acquire" action 702 of FIG. 7 has alternative processing, as shown in FIG. 9. The method begins by initializing several values to "YES", including a "process-flag" and an "add-flag."

Since each Context may be acquired by several different Probes, when attempting to acquire it, each of its existing Probes must be examined. Therefore, the method selects a first probe that has acquired the context (903) and compares the probe against a current probe (904).

If one of the existing Probes is strictly "better" than the one attempting to acquire (using costs or other criteria) (907), no further processing is needed for the new Probe. In this case, the flags "process-flag" and "add-flag" are set to "NO".

If one of the existing Probes is strictly "worse" than the one attempting to acquire (using costs or other criteria), then this is the "out of order" case. The new Probe re-acquires the position held by the existing Probe (906) and processing continues. In this case, the "add-flag" value is set to "NO", but the "process-flag" continues with its prior setting.

If the two Probes can be compared but their cost and other criteria are the same, then the canonical ordering comparison is used to determine which would be the canonical choice (905). If the existing one is not the canonical choice, the new Probe re-acquires its position (909). In either case, no further processing is needed, with the flags "process-flag" and "add-flag" set to "NO".

A determination is made whether there are more probes to process (910). If so, then the next probe is selected (911) and the method returns to 904. If not, then a further determination is made whether the "add-flag" is still set (912). If so, then the method acquires this context (913). Another determination is then made whether the "process-flag" is still set (914). If so, then the method continues processing probes (916). Otherwise, the method stops processing probes at that point (918).

The above approaches assume that the cost functions are monotonic. That is, when a Probe is processed, every new Probe it creates has a cost equal to or larger than it. Not all applications of a costed-search have this property. This can occur, for example, in a topological resolution engine. The cost for a Probe might represent the change in total path length for all paths. If the Probe represented the action of shoving a via, this would normally have a positive cost because shoving a via would normally make its length longer. However, it is possible that shoving a via might make its path shorter. In this case the cost of the Probe would be less than the cost of the Probe that created it.

If costs are not monotonic, then the "Check for Solution" action 704 of FIG. 7 may no longer be deterministic. This is because the pruning operation might delete a Probe with a higher cost that might lead to a solution with a lower cost. In general, it may be difficult or impossible to know which Probes can safely be pruned if the cost function is not monotonic. All possible solutions must be found before it can be known which solution has the lowest total cost.

Checking for every possible solution is, in most cases, too slow and inefficient. In this situation, a compromise may be employed and some Probes may be pruned. However, if the decision of which Probes to prune is based entirely on the cost of the first solution found, then the algorithm becomes non-deterministic. A solution that would be found if its Probe is pruned early would not be found if its Probe was processed before the pruning operation occurred.

One solution to this is a "high water mark". In addition to a cost, each Probe carries a high water mark. For each Probe, the high water mark is defined to be the highest cost of any Probes leading to it. For example, if a Probe with cost 412 generates a Probe with cost 300, then the high water mark of the new Probe is 412. Action 704 of FIG. 7 can use the high water mark to determine which Probes to prune. When a solution is found, any Probes with a high water mark larger than the high water mark of the Probe leading to the solution can be pruned.

Unfortunately, in order to be deterministic, sometimes the method will need to discard solutions that are better than the one it selects. In particular, when two solutions are compared (in 704 to determine which is better), prior to comparing their costs, their high water marks must be compared. A solution with a lower high water mark is considered better even if its cost is worse. This restriction prevents the method from selecting a solution that would have been missed if the Probes were processed using only one thread.

The product should be deterministic if it needs to be tested using a regression suite. However, it is advantageous to also be able to operate the product non-deterministically, since bugs are less likely to be repeatable and simply running the application again after a failure might avoid the bug. However, it is exceedingly dangerous to ship products that have not been tested. Therefore, it is critical that the shipped product and the tested product be identical. Further, the algorithms run in the shipped product must be nearly identical to the algorithms run in the tested product.

To accomplish this, in some embodiments, product can be manufactured to enable it to exhibit either deterministic or chaotic behavior. One such change is to have the canonical comparison function always return "false" if two Probes have the same cost. With the variation, the first Probe processed is always considered "better" than any Probes processed later. Another such change is to skip the high water mark test when comparing to solutions. With this change, if the algorithm happens to find a better solution, it will be used even though the canonical rules would not allow it.

Data Structures

Data structures that can be used to implement an embodiment of the invention will now be described. Examples of such data structures include: Contexts, Probes, and the Priority Queue.

A Context object represents a state in the search. These are completely dependent on the application. They are essentially the same as the information that would have been used in a single-threaded search. A Context might represent, for example, a location, a set of database changes, or any other information needed to keep track of decisions in the search that have already been made. In some cases, all possible Context objects might exist prior to beginning the search. In other cases, Context objects are constructed on-the-fly during the search.

For example, if the application of the search is the path finding algorithm of an autorouter (SCR), which is described in more detail below, then the Context objects represent locations or "channels" reached thus far in the search. In this example, Context objects are simply pointers to data that already exist. The Initial Context objects are the valid starting (or source) locations (usually component pins). The Final Context objects are the valid ending (or target) locations (usually component pins).

Another example application of the search is the topological transformations in an autorouter to improve constraint compliance (TOPO) (described in more detail below). In this case, the Context objects represent a set of changes to the database made by a series of transformation actions. In this example, no Context objects exist prior to starting the search except for the Initial Context, which is the empty set (i.e. no changes). A Final Context is any context that meets the current goals of the transformation, such as not having any overloads or not having too much crosstalk.

A Probe is a transition from one Context to another Context. In an embodiment, it has pointers or some other representation to designate a pair of Context objects. The two Context objects are called the "from-Context" and the "to-Context" objects. The probe is associated with a numeric "cost" information.

In the SCR application, a Probe is the consideration of advancing the partial path from one location to another on the same layer or from one layer to another at the same location. Its cost is an estimate of the additional cost to extend the path. This will normally be an A*-cost, that is, it will also include the estimated cost to reach the nearest Final Context.

In the TOPO application, a Probe is a single modification to the topological database, such as moving one via from one location to another location.

The Priority Queue is a container that stores all of the Probe objects that are waiting to be processed. It is associated with two operations: push and pop. The Push operation adds one Probe to the container. It should always succeed (with the assumption of sufficient memory). The Pop operation attempts to remove one Probe from the container. This operation can fail if the queue was empty. One important feature of a Priority Queue in some embodiments is that the Pop operation always returns the lowest cost (or highest priority) item that is currently in the queue.

There are multiple approaches that can be taken to implement a Priority Queue. One approach is for the pop operation to search all items currently in the queue and remove the lowest cost (highest priority) item that it finds. Then, the push operation can simply insert the new item anywhere in the queue. Another approach is for the push operation to insert the new item at the appropriate location in the queue. In this case, the pop operation can simply remove the first item. Any suitable approach can be taken to implement a priority queue. For example, the approaches described in the following documents may be employed in some embodiments of the invention, each of which are hereby incorporated by reference in their entirety: (a) "Calendar queues: a fast 0(1) priority queue implementation for the simulation event set problem", by R. Brown, *Communications of the ACM*, October 1988, Volume 31 Issue 10; (b) "Ladder queue: An O(1) priority queue structure for large-scale discrete event simulation", by Wai Teng Tang, Rick Siow Mong Goh, by Ian Li-Jin Thng. *ACM Transactions on Modeling and Computer Simulation* (TOMACS), July 2005, Volume 15 Issue 3; and (c) "A comparative study of parallel and sequential priority queue algorithms", by Robert Rönngren, Rassul Ayani. *ACM Transactions on Modeling and Computer Simulation* (TOMACS), April 1997, Volume 7 Issue 2.

EXAMPLE APPLICATIONS

One application of this embodiment of the invention is the path finding algorithm in an autorouter. Many modern autorouters use a costed-wavefront as the underlying engine. This engine finds one path between two terminals or pins. This is referred to herein as a Single Connection Router (SCR).

Using the terminology of costed-search, the Initial Contexts are the starting pin or pins where the path will start. The Final Contexts are the ending pin or pins where the path must end. The other Contexts are channels (available space between existing objects). A Probe is an exploration of moving from Context to another Context. These two Contexts can be in different locations on the same layer. Or, they can be in the same location on two different layers. A solution is a set of moves from one of the starting pins to one of the ending pins. The cost for a Probe is a numeric value estimating the quality of its move. This cost might be simply the distance between its from-Context and its to-Context. Processing a Probe means finding all legal moves from its to-Context to another Context and pushing them onto the Priority Queue.

Traditionally, an SCR algorithm has been limited to single-threaded use. This invention allows multi-threading yet preserves determinate results.

Another potential application of this invention is the engine used in an autorouter to resolve topological overload resolution, here referred to as TOPO. This engine attempts to transform a given routing plan expressed as a topological graph into a "better" plan. For example, if there are too many paths planned between two particular nodes (such as vias) than available space, the algorithm might decide to "shove" one of the vias to another location. Unfortunately, this might cause a new overload somewhere else. So, the algorithm must try to resolve the new overload before it can conclude that it has found a legal solution to the initial problem.

Typically, topological overload resolution is performed using a depth-first algorithm. However, using a costed-search approach insures that the best possible solution is found and makes it possible to use a multi-threaded approach.

Using the costed-search terminology, a Context is any given state of the topological plan. An Action is any transformation of a Context into a new Context, such as shoving a via. The Initial Context is the state of the plan prior to performing any actions. A Final Context is any Context with fewer topological overloads. The Cost of an Action is a numeric estimate of the change in quality resulting from that Action. This cost might be simple, such as the change in total length of all etch in the entire Plan. Or, it could be much more complex, incorporating design rule considerations, such as crosstalk or other transmission line issues.

The invention may be applied to implement an autorouter for either PCB routing or IC routing. In addition, it can be applied to any other type of EDA tool that implements multi-processing, such as multi-threaded layout and placement tools or design rule checking tools.

The invention may also be used in other routing applications beyond the EDA tool space, such as Internet packet routing and automotive GPS routing system. Another potential application of the invention is for game solving. In general, the invention may be applied to any costed-based approach that needs the power of concurrent processing on multiple CPU systems and also needs the ability for deterministic operation.

Figure 10:
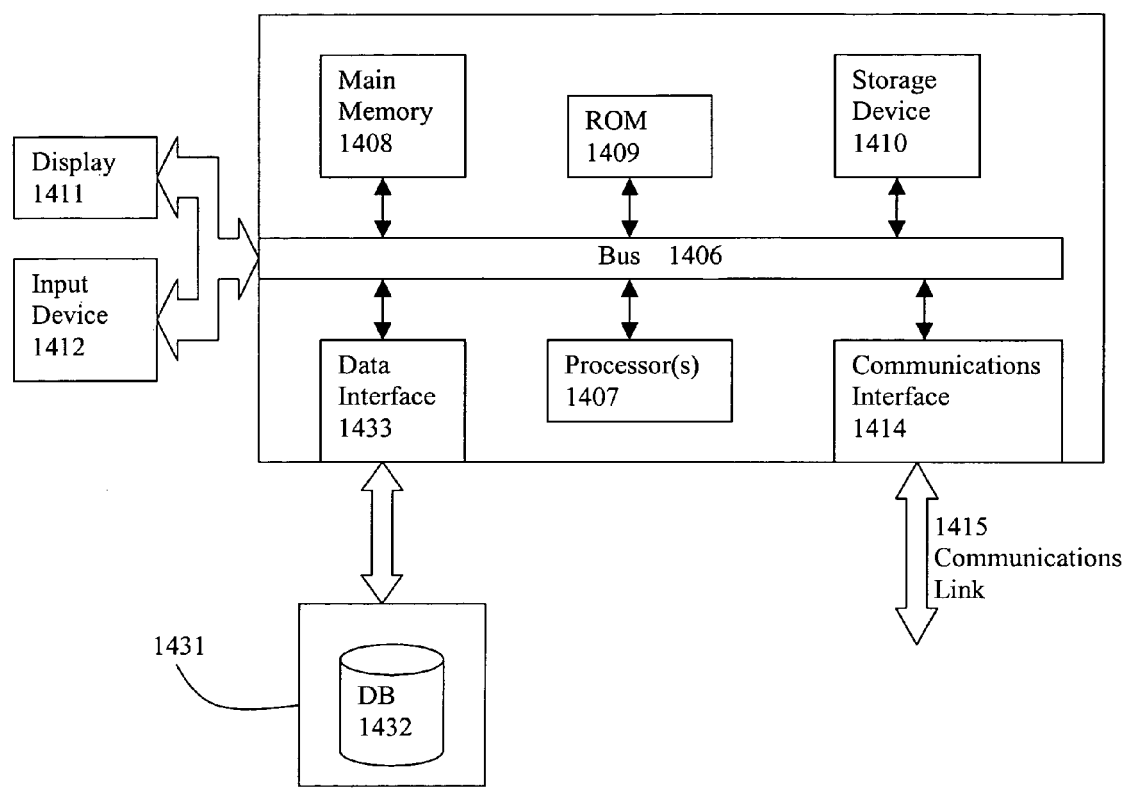
FIG. 10 illustrates an example computing architecture with which embodiments of the invention may be practiced.

FIG. 10 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method for implementing multi-processing by multiple processing entities for autorouting an electronic design, comprising:
   identifying costs for routing choices for work processed by the multiple processing entities;
   determining if two or more of the routing choices have a same cost;
   determining a secondary ordering value for the two or more of the routing choices with the same cost;

storing the secondary ordering value in a volatile or nonvolatile computer readable medium or displaying the secondary ordering value on a display device; and selecting using a processor a preferred routing choice based at least in part upon the secondary ordering value, in which the two or more of the routing choices can be processed out-of-order in a deterministic manner using total ordering or partial ordering.

2. The method of claim 1 in which the secondary ordering value is selected using a method that provides deterministic behavior.

3. The method of claim 2 in which canonical ordering is employed for the secondary ordering value.

4. The method of claim 3 in which the canonical ordering comprises properties of reflexivity, anti-symmetry, transitivity, and comparability.

5. The method of claim 3 in which the canonical ordering is based upon either length, angle, location, or name.

6. The method of claim 1 in which the secondary ordering value is selected using a method that optionally provides either deterministic behavior or non-deterministic behavior.

7. The method of claim 6 in which non-deterministic behavior is implemented by having the secondary ordering value always select the first of the two or more routing choices that have the same cost.

8. The method of claim 1 in which the total ordering comprises properties of reflexivity, anti-symmetry, transitivity, and comparability.

9. The method of claim 1 in which the routing choices are associated with more information than cost.

10. The method of claim 9 in which the routing choices are associated with information relating to ultimate viability or constraints of a routing path.

11. The method of claim 1 in which the costs are non-monotonic costs.

12. The method of claim 11 in which the routing choices are associated with a high-water mark comprising the highest cost of a choice along its path.

13. The method of claim 12 in which a routing choice having a cost greater than the high water mark is pruned.

14. The method of claim 1 in which the preferred routing choice is selected to implement path selection in an autorouter.

15. The method of claim 1 in which the preferred routing choice is selected to implement path improvement in an autorouter.

16. The method of claim 1 in which the electronic design is either an IC, PCB design, IC packaging, or SiP.

17. The method of claim 1 in which the method implements topological overload resolution.

18. The method of claim 1 in which the method implements a single connection router.

19. The method of claim 1 in which a probe is a potential state transition or action, a context is a state or potential state, an initial context is a valid starting state, a final context is a valid ending state, and a solution is a valid sequence of probes from any initial context to any final context, wherein the method comprises:

attempting to acquire an acquired context;
checking whether the acquired context is the final context;
checking other probes from the acquired context; and
pushing the other probes onto a priority queue if corresponding contexts for the other probes have not been acquired.

20. The method of claim 19 in which two probes are compared for both costs and secondary ordering values.

21. The method of claim 19 in which the priority queue pops the lowest cost probe.

22. A system for implementing multi-processing by multiple processing entities for autorouting an electronic design, comprising:

means for identifying costs for routing choices for work processed by the multiple processing entities;
means for determining if two or more of the routing choices have a same cost;
means for determining a secondary ordering value for the two or more of the routing choices with the same cost;
a volatile or non-volatile computer readable medium for storing the secondary ordering value or a display device for displaying the secondary ordering value; and
a processor for selecting a preferred routing choice based upon the secondary ordering value, in which the two or more of the routing choices can be processed out-of-order in a deterministic manner using total ordering or partial ordering.

23. The system of claim 22 in which the secondary ordering value is selected using a method that provides deterministic behavior.

24. The system of claim 22 in which the secondary ordering value is selected using a method that optionally provides either deterministic behavior or non-deterministic behavior.

25. A computer program product comprising a tangible computer usable medium having executable code to execute a process using a processor for implementing multi-processing by multiple processing entities for autorouting an electronic design, the process comprising:

identifying costs for routing choices for work processed by the multiple processing entities;
determining if two or more of the routing choices have a same cost;
determining a secondary ordering value for the two or more of the routing choices with the same cost;
storing the secondary ordering value or displaying the secondary ordering value on a display device; and
selecting a preferred routing choice based at least in part upon the secondary ordering value, in which the two or more of the routing choices can be processed out-of-order in a deterministic manner using total ordering or partial ordering.

26. The product of claim 25 in which the secondary ordering value is selected using a method that provides deterministic behavior.

27. The product of claim 25 in which the secondary ordering value is selected using a method that optionally provides either deterministic behavior or non-deterministic behavior.

28. A method for implementing multi-processing by multiple processing entities for electronic processing of a set of workload, comprising:

identifying costs for processing choices for work processed by the multiple processing entities;
determining if two or more of the processing choices have a same cost;
determining a secondary ordering value for the two or more of the processing choices with the same cost;
storing the second ordering value in a volatile or non-volatile computer readable medium or displaying the secondary ordering value on a display device; and
selecting using a processor a preferred processing choice based at least in part upon the secondary ordering value, in which the two or more of the processing choices can be processed out-of-order in a deterministic manner using total ordering or partial ordering.

29. The method of claim 28 in which the secondary ordering value is selected using a method that provides deterministic behavior.

30. The method of claim 28 in which the secondary ordering value is selected using a method that optionally provides either deterministic behavior or non-deterministic behavior.

31. The method of claim 28 in which the costs are non-monotonic costs.

32. The method of claim 28 in which a probe is a potential state transition or an action, a context is a state or a potential state, an initial context is a valid starting state, a final context is a valid ending state, and a solution is a valid sequence of probes from any initial context to any final context, wherein the method comprises:
  attempting to acquire an acquired context;
  checking whether the acquired context is the final context;
  checking other probes from the acquired context; and
  pushing the other probes onto a priority queue if corresponding contexts for the other probes have not been acquired.

33. The method of claim 32 in which two probes are compared for both costs and secondary ordering values.

34. The method of claim 32 in which the priority queue pops the lowest cost probe.

35. A system for implementing multi-processing by multiple processing entities for electronic processing of a set of workload, comprising:
  means for identifying costs for processing choices for work processed by the multiple processing entities;
  means for determining if two or more of the processing choices have a same cost;
  means for determining a secondary ordering value for the two or more of the processing choices with the same cost;
  a volatile or non-volatile computer readable medium for storing the second ordering value or a display device for displaying the secondary ordering value; and
  a processor for selecting a preferred processing choice based at least in part upon the secondary ordering value, in which the two or more of the processing choices can be processed out-of-order in a deterministic manner using total ordering or partial ordering.

36. The system of claim 35 in which the secondary ordering value is selected using a method that provides deterministic behavior.

37. The system of claim 35 in which the secondary ordering value is selected using a method that optionally provides either deterministic behavior or non-deterministic behavior.

38. A computer program product comprising a tangible computer usable medium having executable code to execute a process for implementing multi-processing by multiple processing entities for electronic processing of a set of workload, the process comprising:
  identifying costs for processing choices for work processed by the multiple processing entities;
  determining if two or more of the processing choices have a same cost;
  determining a secondary ordering value for the two or more of the processing choices with the same cost;
  storing the second ordering value in a volatile or non-volatile computer readable medium or displaying the secondary ordering value on a display device; and
  selecting using a processor a preferred processing choice based at least in part upon the secondary ordering value, in which the two or more of the processing choices can be processed out-of-order in a deterministic manner using total ordering or partial ordering.

39. The product of claim 38 in which the secondary ordering value is selected using a method that provides deterministic behavior.

40. The product of claim 38 in which the secondary ordering value is selected using a method that optionally provides either deterministic behavior or non-deterministic behavior.

* * * * *